(12) United States Patent
Shim et al.

(10) Patent No.: US 8,685,195 B2
(45) Date of Patent: Apr. 1, 2014

(54) SOFT LITHOGRAPHIC MOLDING OF SURFACE RELIEF OUTPUT COUPLERS FOR ORGANIC LIGHT EMITTING DIODES

(76) Inventors: Anne Shim, Billerica, MA (US); John Rogers, Champaign, IL (US); Feng Hua, Potsdam, NY (US)

( * ) Notice: Subject to any disclaimer, the term of this patent is extended or adjusted under 35 U.S.C. 154(b) by 1227 days.

(21) Appl. No.: 12/161,971

(22) PCT Filed: Jan. 29, 2007

(86) PCT No.: PCT/US2007/061198
§ 371 (c)(1),
(2), (4) Date: Nov. 20, 2008

(87) PCT Pub. No.: WO2007/127513
PCT Pub. Date: Nov. 8, 2007

(65) Prior Publication Data
US 2009/0212310 A1    Aug. 27, 2009

Related U.S. Application Data

(60) Provisional application No. 60/763,584, filed on Jan. 31, 2006.

(51) Int. Cl.
*B29C 47/00* (2006.01)
(52) U.S. Cl.
USPC ........... 156/245; 264/225; 264/299; 264/310; 313/504; 313/511; 359/599

(58) Field of Classification Search
USPC ............ 156/245; 264/225, 319, 331.11, 299, 264/310; 428/156; 313/504, 511; 359/599
See application file for complete search history.

(56) References Cited

U.S. PATENT DOCUMENTS

| | | | |
|---|---|---|---|
| 6,777,871 B2 * | 8/2004 | Duggal et al. | 313/506 |
| 6,984,934 B2 * | 1/2006 | Moller et al. | 313/504 |
| 7,574,097 B2 * | 8/2009 | Aoi et al. | 385/143 |
| 7,972,875 B2 * | 7/2011 | Rogers et al. | 438/21 |
| 2001/0033135 A1 | 10/2001 | Duggal et al. | 313/506 |
| 2003/0020399 A1 | 1/2003 | Moller et al. | 313/504 |
| 2005/0205863 A1 | 9/2005 | Choi et al. | 257/40 |
| 2005/0238967 A1 * | 10/2005 | Rogers et al. | 430/5 |

FOREIGN PATENT DOCUMENTS

| | | | | |
|---|---|---|---|---|
| EP | 1443563 A2 | 8/2004 | | H01L 27/00 |
| EP | 1494297 A2 | 1/2005 | | H01L 51/20 |

OTHER PUBLICATIONS

PCT Search Report PCT/US07/61198 dated Feb. 18, 2008.

* cited by examiner

*Primary Examiner* — Gerard Higgins
(74) *Attorney, Agent, or Firm* — Brinks Gilson & Lione (57) ABSTRACT

The present invention provides a method and apparatus for surface relief output coupling in organic light emitting diodes is provided. The method includes forming a pattern in a surface of an elastomer (310) and laminating at least a portion of the pattern to a surface of an organic light emitting diode (305).

11 Claims, 5 Drawing Sheets

SOFT LITHOGRAPHIC MOLDING OF SURFACE RELIEF OUTPUT COUPLERS FOR ORGANIC LIGHT EMITTING DIODES

CROSS REFERENCE TO RELATED APPLICATIONS

This application is a continuation of PCT Application Serial No. PCT/US2007/061198 filed Jan. 29, 2007, designating the United States and published in English, which claims the benefit of the filing date under 35 U.S.C. 119(e) of U.S. Provisional Application No. 60/763,584 filed Jan. 31, 2006, the entire contents of which are hereby incorporated by reference.

BACKGROUND OF THE INVENTION

1. Field of the Invention

This invention relates generally to organic light emitting diodes, and, more particularly, to electrophosphorescent organic light emitting diodes.

2. Description of the Related Art

Figure 1:
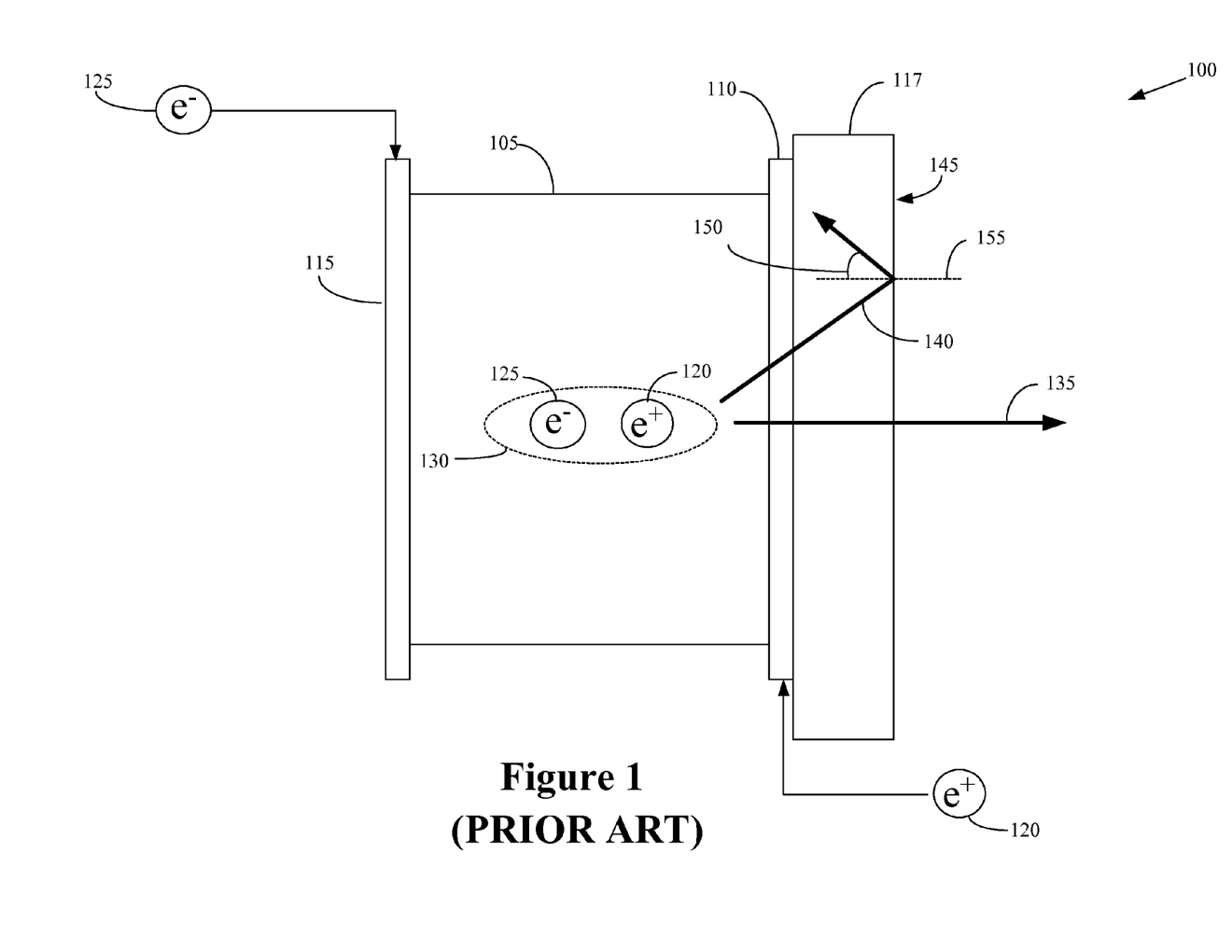
FIG. 1 conceptually illustrates a conventional organic light emitting diode (OLED) that includes an emissive layer sandwiched between an anode and a cathode.

An organic light-emitting diode (OLED) is a thin-film light-emitting diode that uses an organic compound as an emissive layer. FIG. 1 conceptually illustrates a conventional OLED 100 that includes an emissive layer 105 sandwiched between an anode 110 and a cathode 115. The anode 110 is typically formed on a glass substrate 117 using a transparent material such as indium tin oxide (ITO). Holes 120 may be provided to the emissive layer 105 via the anode 110. The cathode 115 is typically formed of a metal (such as aluminum or calcium) and is used to provide electrons 125 to the emissive layer 105. In some embodiments, the cathode 115 may also be transparent. The holes 120 and the electrons 125 in the emissive layer 105 may combine to form excitons 130. The excitons 130 decay when the hole 120 and the electron 125 combine and release the energy stored in the exciton 130 as heat and/or light.

A portion of the light released when the exciton 130 decays is emitted through the anode 110 and the glass substrate 117, as indicated by the arrow 135. However, some of the light released when the exciton 130 decays (indicated by the arrow 140) intersects the interface 145 between the glass substrate 117 and the air at an angle 150 relative to a normal 155 to the interface 145 that is larger than a critical angle for total internal reflection. Consequently, the light 140 is reflected back into the OLED 100. Over 80% of the light generated in a conventional planar OLED 100 may be lost to internal reflection and waveguiding. Light released by the exciton 130 may also be totally internally reflected at other interfaces, such as the interfaces between the emissive layer 105 and the anode 110 and/or the interface between the anode 110 and glass substrate 117. However, the contrast in indices of refraction is typically largest at the interface 145, so total internal reflection at the interface 145 is typically the largest contributor to the reduction in the external quantum efficiency of the OLED 100.

One well-known technique for increasing the external quantum efficiency of the OLED 100 is to form a scattering (or relief) structure at or near the interface 145. A wide range of integrated optical devices and optoelectronic devices include relief structures with features sizes comparable to the wavelength of the light emitted by the emissive layer 105. The relief structures may function as mode and/or output couplers, filters, laser resonators, and other components. Fabrication of the relief structures is typically accomplished with modified versions of techniques—photolithography and electron beam lithography—that have their origins in the microelectronics industry. Integrating similar elements into OLEDs 100 may improve their external quantum efficiencies by coupling photons out of planar waveguides defined by the various device layers. However, these traditional optoelectronic fabrication techniques are poorly suited to use in OLEDs 100, at least in part because of the operational complexities of the techniques, high costs, and/or the inability to pattern large areas. Furthermore, only a narrow range of OLED materials are chemically compatible with the resists, solvents and developers used by these methods.

SUMMARY OF THE INVENTION

The present invention is directed to addressing the effects of one or more of the problems set forth above. The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In one embodiment of the instant invention, an apparatus is provided for a surface relief output coupler in organic light emitting diodes. The apparatus includes an organic light emitting diode and a pattern comprising an elastomer. A portion of the pattern is adjacent at least one surface of the organic light emitting diode.

In one embodiment of the present invention, a method is provided for surface relief output coupling in organic light emitting diodes. The method includes forming a pattern in a surface of an elastomer and laminating at least a portion of the pattern to a surface of an organic light emitting diode.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions should be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 2:
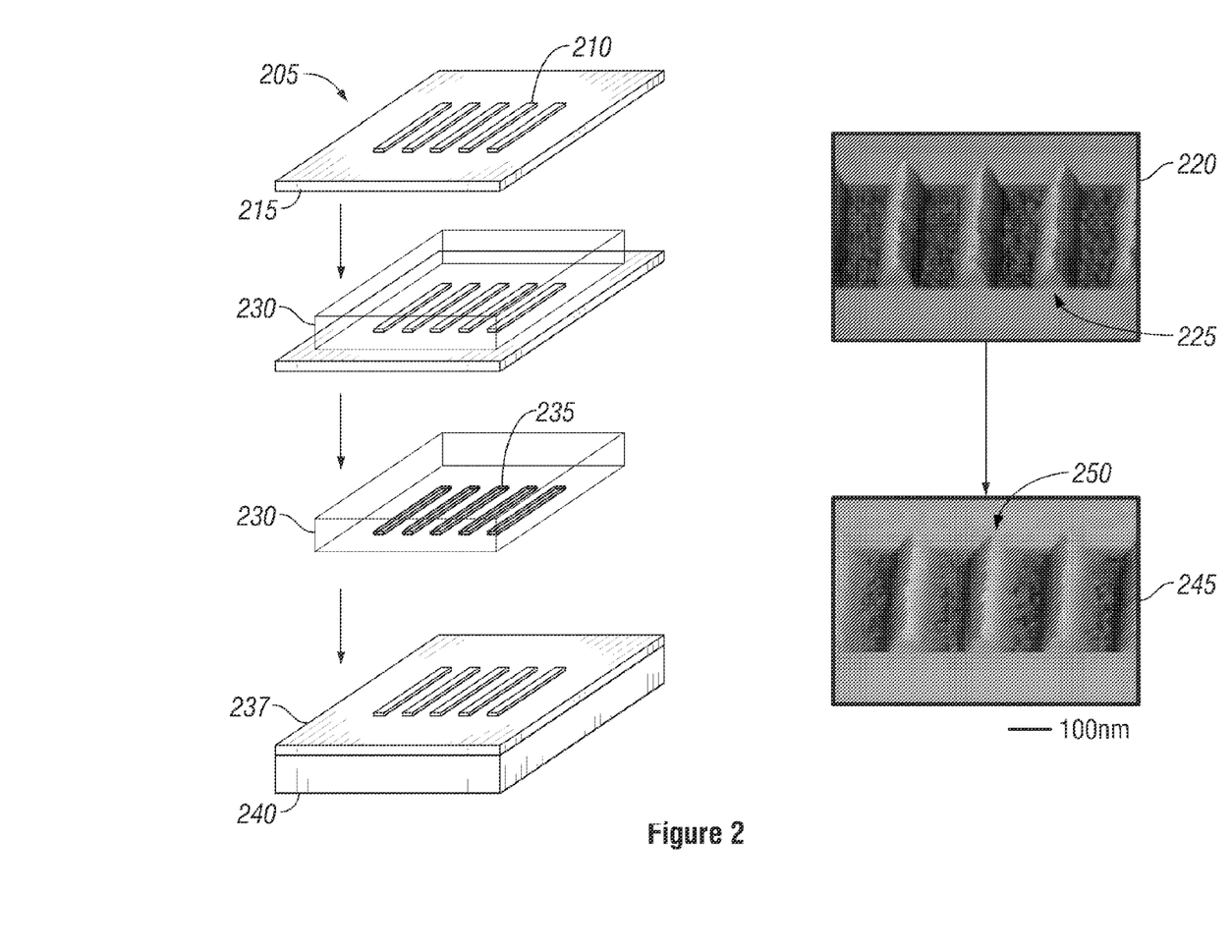
FIG. 2 conceptually illustrates one exemplary embodiment of a soft lithographic molding technique, in accordance with the present invention.

FIG. 2 conceptually illustrates one exemplary embodiment of a soft lithographic molding technique. In the illustrated embodiment, a master pattern 205 including a relief structure 210 is provided. For example, the master pattern 205 may include a relief structure 210 that is formed from a pattern of photoresist 210 using conventional photolithographic techniques on a silicon wafer 215. The inset 220 shows one embodiment of the relief structure 210 in which the relief structure 210 includes a plurality of raised features 225. However, persons of ordinary skill in the art should appreciate that the relief structure 210 may be formed of any type feature, including trenches, and in any pattern.

A curable silicon-containing composition may be cast and then cured (cross-linked) against the master structure 205 to form a mold 230 of an elastomer. In the illustrated embodiment, the elastomer of the mold 230 is a silicon-containing elastomer. As used herein, the term "elastomer" is defined as a cured (cross-linked) or partially cured polymeric material that can return to its initial dimensions when deformed by an external force. A cured polymeric material is considered an elastomer when the cured polymeric material meets the following standard. A sample of the elastomer in its solid state and having an initial linear dimension of $D°$ is subjected to a force such that the dimension is changed by about 10%. If the dimension of an elastomer assumes a value $D^e$, where $D^e \approx D° \pm 0.01 D°$ once the force is no longer applied, the cross-linked polymeric material is considered an elastomer. As used herein, the term "silicon-containing elastomer," is an elastomer which contains silicon atoms. Examples of silicon-containing elastomers may be found in U.S. Pat. No. 6,805,809, which is incorporated herein by reference in its entirety.

In one embodiment, the mold 230 is formed by spin-casting a curable silicon-containing composition onto the master structure 205 and curing the silicon-containing composition to form the mold 230 comprising the elastomer. As used herein, the term "curing" means the conversion of a liquid or semisolid composition to a cross-linked product. For example, the curing process may convert the curable silicon-containing composition to a cross-linked product. Persons of ordinary skill in the art having benefit of the present disclosure should appreciate that the present invention is not limited to forming the mold 230 by curing silicon-containing compositions. In alternative embodiments, the mold 230 may be formed using curable or non-curable resins.

Examples of curable silicone compositions include, but are not limited to, hydrosilylation-curable silicone compositions, peroxide curable silicone compositions, condensation-curable silicone compositions, epoxy-curable silicone compositions; ultraviolet radiation-curable silicone compositions, high-energy radiation-curable silicone compositions, and organo-silicone compositions with the same functionalities. The curable silicon compositions include monomers or polymers having curable or cross-linkable functionality, Examples of such polymers include, but are not limited to, polysiloxanes (linear, branched, resins, and the like), block copolymers containing segments of siloxane repeat units and organic repeat units, and silicon-modified polymers.

Curable silicone compositions and methods for their preparation are well known in the art. For example, a suitable hydrosilylation-curable silicone composition typically comprises (i) an organopolysiloxane containing an average of at least two silicon-bonded alkenyl groups per molecule, (ii) an organohydrogensiloxane containing an average of at least two silicon-bonded hydrogen atoms per molecule in an amount sufficient to cure the composition, and (iii) a hydrosilylation catalyst. The hydrosilylation catalyst can be any of the well known hydrosilylation catalysts comprising a platinum group metal, a compound containing a platinum group metal, or a microencapsulated platinum group metal-containing catalyst. Platinum group metals include platinum, rhodium, ruthenium, palladium, osmium and iridium. Preferably, the platinum group metal is platinum, based on its high activity in hydrosilylation reactions.

The hydrosilylation-curable silicone composition can be a one-part composition or a multi-part composition comprising the components in two or more parts. Room-temperature vulcanizable (RTV) compositions typically comprise two parts, one part containing the organopolysiloxane and catalyst and another part containing the organohydrogensiloxane and any optional ingredients. Hydrosilylation-curable silicone compositions that cure at elevated temperatures can be formulated as one-part or multi-part compositions. For example, liquid silicone rubber (LSR) compositions are typically formulated as two-part systems. One-part compositions typically contain a platinum catalyst inhibitor to ensure adequate shelf life.

A suitable peroxide-curable silicone composition typically comprises (i) an organopolysiloxane and (ii) an organic peroxide. Examples of organic peroxides include, diaroyl peroxides such as dibenzoyl peroxide, di-p-chlorobenzoyl peroxide, and bis-2,4-dichlorobenzoyl peroxide; dialkyl peroxides such as di-t-butyl peroxide and 2,5-dimethyl-2,5-di-(t-butylperoxy)hexane; diaralkyl peroxides such as dicumyl peroxide; alkyl aralkyl peroxides such as t-butyl cumyl peroxide and 1,4-bis(t-butylperoxyisopropyl)benzene; and alkyl aroyl peroxides such as t-butyl perbenzoate, t-butyl peracetate, and t-butyl peroctoate.

A condensation-curable silicone composition typically comprises (i) an organopolysiloxane containing an average of at least two hydroxy groups per molecule; and (ii) a tri- or tetra-functional silane containing hydrolysable Si—O or Si—N bonds. Examples of silanes include alkoxysilanes such as CH3Si(OCH3)3, CH3Si(OCH2CH3)3, CH3 Si(OCH2CH2CH3)3, CH3 Si[O(CH2)3 CH3]3, CH3CH2Si (OCH2CH3)3, C6H5Si(OCH3)3, C6H5CH2Si(OCH3)3, C6H5Si(OCH2CH3)3, CH2=CHSi(OCH3)3, CH2=CHCH2Si(OCH3)3, CF3CH2CH2Si(OCH3)3, CH3 Si(OCH2CH2OCH3)3, CF3CH2CH2Si(OCH2CH2OCH3) 3, CH2=CHSi(OCH2CH2OCH3)3, CH2=CHCH2Si (OCH2CH2OCH3)3, C6H5Si(OCH2CH2OCH3)3, Si(OCH3)4, Si(OC2H5)4, and Si(OC3H7)4; organoacetoxysilanes such as CH3Si(OCOCH3)3, CH3CH2Si(OCOCH3) 3, and CH2=CHSi(OCOCH3)3; organoiminooxysilanes such as CH3Si[O—N=C(CH3)CH2CH3]3, Si[O—N=C (CH3)CH2CH3]4, and CH2=CHSi[O—N=C(CH3) CH2CH3]3; organoacetamidosilanes such as $CH_3Si[NHC$ $(=O)CH_3]_3$ and $C_6H_5Si[NHC(=O)CH_3]_3$; aminosilanes such as $CH_3Si[NH(s-C_4H_9)]_3$ and $CH_3Si(NHC_6H_{11})_3$; and organoaminooxysilanes.

A condensation-curable silicone composition can also contain a condensation catalyst to initiate and accelerate the condensation reaction. Examples of condensation catalysts include, but are not limited to, amines; and complexes of lead, tin, zinc, and iron with carboxylic acids. Tin(II) octoates, laurates, and oleates, as well as the salts of dibutyl tin, are particularly useful. The condensation-curable silicone composition can be a one-part composition or a multi-part composition comprising the components in two or more parts. For example, room-temperature vulcanizable (RTV) compositions can be formulated as one-part or two-part compositions. In the two-part composition, one of the parts typically includes a small amount of water.

A suitable epoxy-curable silicone composition typically comprises (i) an organopolysiloxane containing an average of at least two epoxy-functional groups per molecule and (ii) a curing agent. Examples of epoxy-functional groups include 2-glycidoxyethyl, 3-glycidoxypropyl, 4-glycidoxybutyl, 2,(3,4-epoxycyclohexyl)ethyl, 3-(3,4-epoxycyclohexyl)propyl, 2,3-epoxypropyl, 3,4-epoxybutyl, and 4,5-epoxypentyl. Examples of curing agents include anhydrides such as phthalic anhydride, hexahydrophthalic anhydride, tetrahydrophthalic anhydride, and dodecenylsuccinic anhydride; polyamines such as diethylenetriamine, triethylenetetramine, diethylenepropylamine, N-(2-hydroxyethyl)diethylenetriamine, N,N'-di(2-hydroxyethyl)diethylenetriamine, m-phenylenediamine, methylenedianiline, aminoethyl piperazine, 4,4-diaminodiphenyl sulfone, benzyldimethylamine, dicyandiamide, and 2-methylimidazole, and triethylamine; Lewis acids such as boron trifluoride monoethylamine; polycarboxylic acids; polymercaptans; polyamides; and amidoamines.

A suitable ultraviolet radiation-curable silicone composition typically comprises (i) an organopolysiloxane containing radiation-sensitive functional groups and (ii) a photoinitiator. Examples of radiation-sensitive functional groups include acryloyl, methacryloyl, mercapto, epoxy, and alkenyl ether groups. The type of photoinitiator depends on the nature of the radiation-sensitive groups in the organopolysiloxane. Examples of photoinitiators include diaryliodonium salts, sulfonium salts, acetophenone, benzophenone, and benzoin and its derivatives.

A suitable high-energy radiation-curable silicone composition comprises an organopolysiloxane polymer. Examples of organpolyosiloxane polymers include polydimethylsiloxanes, poly(methylvinylsiloxanes), and organohydrogenpolysiloxanes. Examples of high-energy radiation include γ-rays and electron beams.

The curable silicone composition of the present invention can comprise additional ingredients. Examples of additional ingredients include, but are not limited to, adhesion promoters, solvents, inorganic fillers, photosensitizers, antioxidants, stabilizers, pigments, and surfactants. Examples of inorganic fillers include, but are not limited to, natural silicas such as crystalline silica, ground crystalline silica, and diatomaceous silica; synthetic silicas such as fused silica, silica gel, pyrogenic silica, and precipitated silica; silicates such as mica, wollastonite, feldspar, and nepheline syenite; metal oxides such as aluminum oxide, titanium dioxide, magnesium oxide, ferric oxide, beryllium oxide, chromium oxide, and zinc oxide; metal nitrides such as boron nitride, silicon nitride, and aluminum nitride, metal carbides such as boron carbide, titanium carbide, and silicon carbide; carbon black; alkaline earth metal carbonates such as calcium carbonate; alkaline earth metal sulfates such as calcium sulfate, magnesium sulfate, and barium sulfate; molybdenum disulfate; zinc sulfate; kaolin; talc; glass fiber; glass beads such as hollow glass microspheres and solid glass microspheres; aluminum trihydrate; asbestos; and metallic powders such as aluminum, copper, nickel, iron, and silver powders.

The silicone composition can be cured by exposure to ambient temperature, elevated temperature, moisture, or radiation, depending on the particular cure mechanism. For example, one-part hydrosilylation-curable silicone compositions are typically cured at an elevated temperature. Two-part hydrosilylation-curable silicone compositions are typically cured at room temperature or an elevated temperature. One-part condensation-curable silicone compositions are typically cured by exposure to atmospheric moisture at room temperature, although cure can be accelerated by application of heat and/or exposure to high humidity. Two-part condensation-curable silicone compositions are typically cured at room temperature; however, cure can be accelerated by application of heat. Peroxide-curable silicone compositions are typically cured at an elevated temperature. Epoxy-curable silicone compositions are typically cured at room temperature or an elevated temperature. Depending on the particular formulation, radiation-curable silicone compositions are typically cured by exposure to radiation, for example, ultraviolet light, gamma rays, or electron beams.

The mold 230 comprising the cured and/or cross-linked silicon-containing composition (e.g., the elastomer) is removed from the master 205, as shown in FIG. 2. In the illustrated embodiment, the silicon-containing composition is completely cured and/or cross-linked while remaining on the master 205. However, persons of ordinary skill in the art should appreciate that the present invention is not limited to completely curing and/or crosslinking the silicon-containing composition while it remains on the master 205. In alternative embodiments, the silicon-containing composition may be partially cured and/or cross-linked while on the master 205. For example, forming the pattern may comprise spin-casting the silicon-containing composition onto the master pattern and at least partially curing the silicon-containing composition at approximately 70° C. The partially cured and/or cross-linked silicon containing composition may then be removed from the master 205 and then the curing and/or crosslinking may be completed after removing the partially cured and/or cross-linked silicon containing composition from the master

205. Completing the curing and/or cross-linking of a partially cured and/or cross-linked silicon-containing composition after removing the partially cured and/or cross-linked silicon-containing composition from the master 205 may have a number of advantages including, but not limited to, increasing the hardness of the completely cured and/or cross-linked silicon-containing composition.

The completed mold 230 may include one or more relief structures 235 corresponding to the relief structures 210. In one embodiment, the relief structures 235 have at least one characteristic dimension that is approximately equal to a characteristic wavelength of light emitted by an organic light emitting diode. The silicon-containing elastomers that are used to form the mold 230 may enable single step, large area patterning of relief structures 235 at nanometer resolution. In one embodiment, a mold 230 having an area of up to 6 ft.$^2$ and including relief structures 235 as small as one nanometer in width, length, height, and/or depth may be formed. However, persons of ordinary skill in the art having benefit of the present disclosure should appreciate that these particular dimensions of the mold 230 and/or the relief structures 235 are exemplary and not intended to limit the present invention. In alternative embodiments, molds 230 having smaller or larger areas and/or including smaller or larger relief structures 235 may be formed. A portion 237 of the completed mold 230 including the relief structures 235 may be brought into contact with a surface 240, such as a surface of an OLED, as will be discussed in detail below. Inset 245 shows one example of relief structures 250 that may be disposed on the surface 240.

Unlike traditional imprinting techniques that rely on hard molds made by patterned etching of brittle inorganic materials, the mold 230 described above may be formed using elastomeric elements that are flexible, robust, and relatively easy to build. The mechanical elasticity of the mold 230, as well as the high elongation, the high physical toughness, and the low Young's modulus of the mold 230 may reduce or prevent damage to the mold 230 and/or the mold part during replication. Furthermore, the very low surface free energies of the elastomeric materials used to form the mold 230 may reduce or eliminate the need for specialized release layers that are typically used in standard imprinting methods.

Figure 3A:
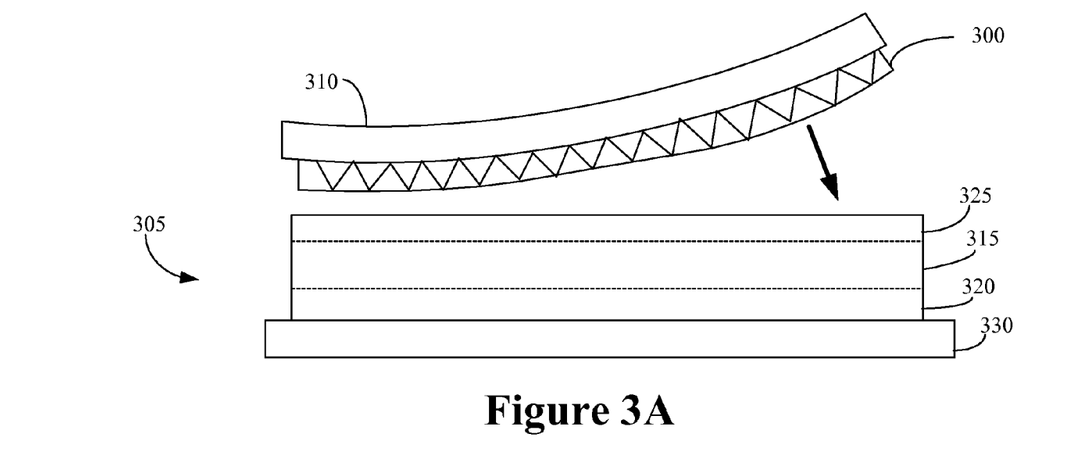
FIGS. 3A-B conceptually illustrate one exemplary embodiment of a technique for laminating a relief structure onto a surface of an OLED, in accordance with the present invention.
Figure 3B:
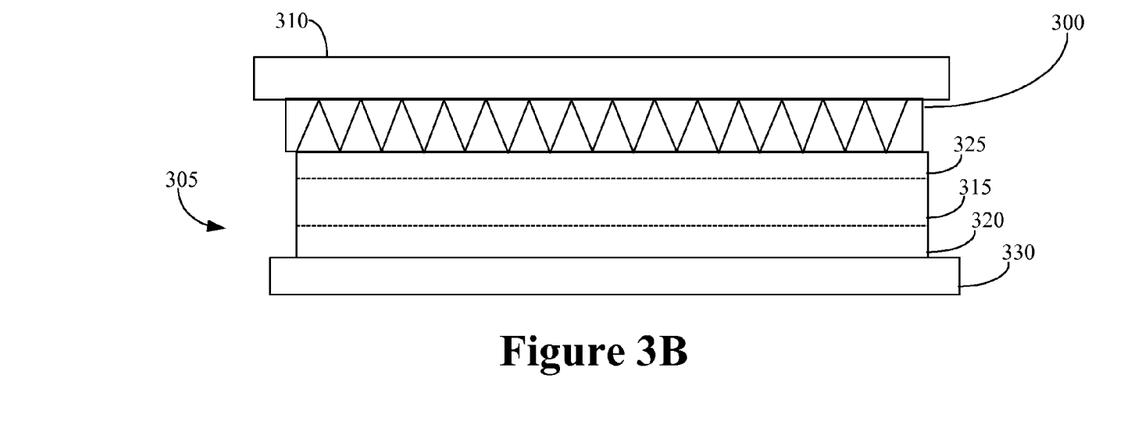

FIGS. 3A-B conceptually illustrate one exemplary embodiment of a technique for laminating a relief structure 300 onto a surface of an OLED 305. In the illustrated embodiment, the relief structure 300 is formed from an elastomer using soft lithographic molding techniques, such as described above. For example, the relief structure 300 may be formed of a silicon-containing elastomer. In the illustrated embodiment, the relief structure 300 is formed on a flexible substrate 310, which may also be formed from an elastomer. For example, the flexible substrate 310 may be formed using the soft lithographic molding techniques described above, either at the same time as the relief structures 300 is formed or a different time. The technique may also comprise bonding the pattern to the flexible substrate 310. In alternative embodiments, the relief structure 300 and/or the flexible substrate 310 may be partially or completely transparent.

The OLED 305 includes an emissive layer 315 sandwiched between an anode 320 and a cathode 325. The anode 315 is formed on a glass substrate 330 using a transparent material such as indium tin oxide (ITO). However, persons of ordinary skill in the art should appreciate that the present invention is not limited to this particular structure for the OLED 305. In alternative embodiments, the OLED 305 may include other layers not shown in FIGS. 3A-B. For example, the OLED 305 may include an electron injection layer, an electron transport layer, a hole transport layer, and the like. In alternative embodiments, the OLED 305, the anode 320, the cathode 325, and/or the glass substrate 330 may be partially or completely transparent.

The relief structures 300 and/or the flexible substrate 310 are brought towards the OLED 305, as shown in FIG. 3A, so that at least one surface of the relief structure 300 comes into contact with at least one surface of the OLED 305, as shown in FIG. 3B. In the illustrated embodiment, a surface of the relief structure 300 comes into contact with a surface of the cathode 325. However, persons of ordinary skill in the art should appreciate that the present invention is not limited to bringing the relief structure 300 into contact with a surface of the cathode 325. In alternative embodiments, relief structures 300 may be brought into contact with any surface or combination of surfaces associated with the OLED 305. Moreover, persons of ordinary skill in the art should also appreciate that layers not shown in FIGS. 3A-B may be included and/or brought into contact with a surface of the relief structures 300 or one or more surfaces of the OLED 305.

In one embodiment, at least a portion of the pattern is laminated to the surface of the OLED 305 using soft contact lamination. The contact between the relief structures 300 and the one or more surfaces of the OLED 305 forms naturally as a result of van der Waals interactions between the surfaces. Accordingly, the contact may occur in ambient conditions without elevated temperatures, applied pressures, or conventional adhesives. The soft contact surface, the absence of adhesives, the ambient temperature of the process, and the low pressures may reduce or eliminate the possibility of damage to the chemically and mechanically fragile classes of ultrathin organic materials that are used to form the OLED 305. Embodiments of the limitation technique described above may also be particularly advantageous for large area OLED lighting applications, at least in part because relatively thin elastomeric layers that enable conformal contact between surfaces of the relief structures 300 and the one or more surfaces of the OLED 305 can be molded with high fidelity, as discussed above.

In one embodiment, the high index molded elastomers that form the relief structures 300 and/or the flexible substrate 310 may be used to encapsulate the OLED 305. The high index molded elastomers that form the relief structures 300 and/or the flexible substrate 310 may also be used to provide an output coupling structure that may enhance the external quantum efficiency of the OLED 305.

Figure 4:
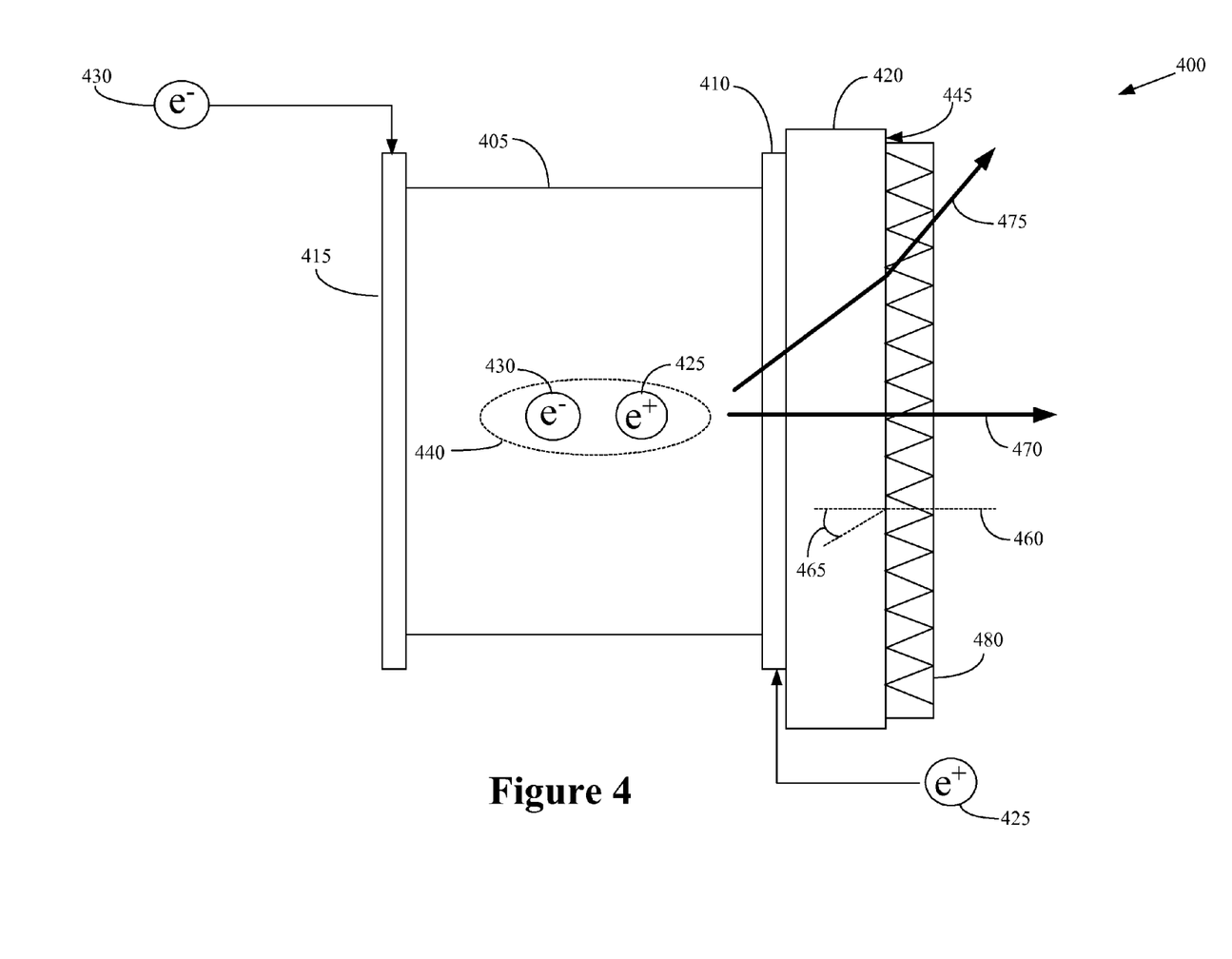
FIG. 4 conceptually illustrates a first exemplary embodiment of an OLED, in accordance with the present invention.

FIG. 4 conceptually illustrates a first exemplary embodiment of an OLED 400 that includes an emissive layer 405 sandwiched between an anode 410 and a cathode 415. In the illustrated embodiment, the anode 410 is formed on a glass substrate 420 using a transparent material such as indium tin oxide (ITO). The cathode 415 may be formed of a metal such as aluminum or calcium. However, persons of ordinary skill in the art having benefit of the present disclosure should appreciate that the anode 410, cathode 415, and/or the substrate 420 may be formed of any material, which may be partially or completely transparent. Moreover, persons of ordinary skill in the art should also appreciate that alternative embodiments of the OLED 400 may include other layers not shown in FIG. 4, such as electronic injection layers, electron transport layers, hole transport layers, and the like.

In operation, holes 425 may be provided to the emissive layer 405 via the anode 410 electrons 430 may be provided to the emissive layer 405 via the cathode 415. The holes 425 and the electrons 430 in the emissive layer 405 may combine to form excitons 440. The excitons 440 may decay and release the energy stored in the exciton 440 as heat and/or light. The light released when the exciton 440 decays may intersect an interface 445 at an angle relative to a normal 460 to the interface 445 that is larger or smaller than a critical angle 465 for total internal reflection for an interface between the material used to form the substrate 420 and air. Consequently, the light 470 that intersects the interface 445 had angle less than the critical angle 465 may pass through the interface, whereas the light 475 that intersects the interface 445 at an angle that is greater than the critical angle 460 may be reflected back into the OLED 400.

In the illustrated embodiment, a relief structure 480 is provided adjacent the interface 445. For example, the relief structure 480 may be laminated onto the interface 445 using embodiments of the lamination techniques described above. The relief structure 480 may function as an output coupler so that at least a portion of the light 475 that intersects the interface 445 at an angle that is greater than the critical angle 460 for total internal reflection at an interface between the material used to form the substrate 420 and air may pass through the interface 445. Consequently, the external quantum efficiency of the OLED 400 may be increased by providing the relief structure 480 adjacent the interface 445. Furthermore, as discussed above, the relief structure 480 may be used to encapsulate at least a portion of the OLED 400.

Figure 5:
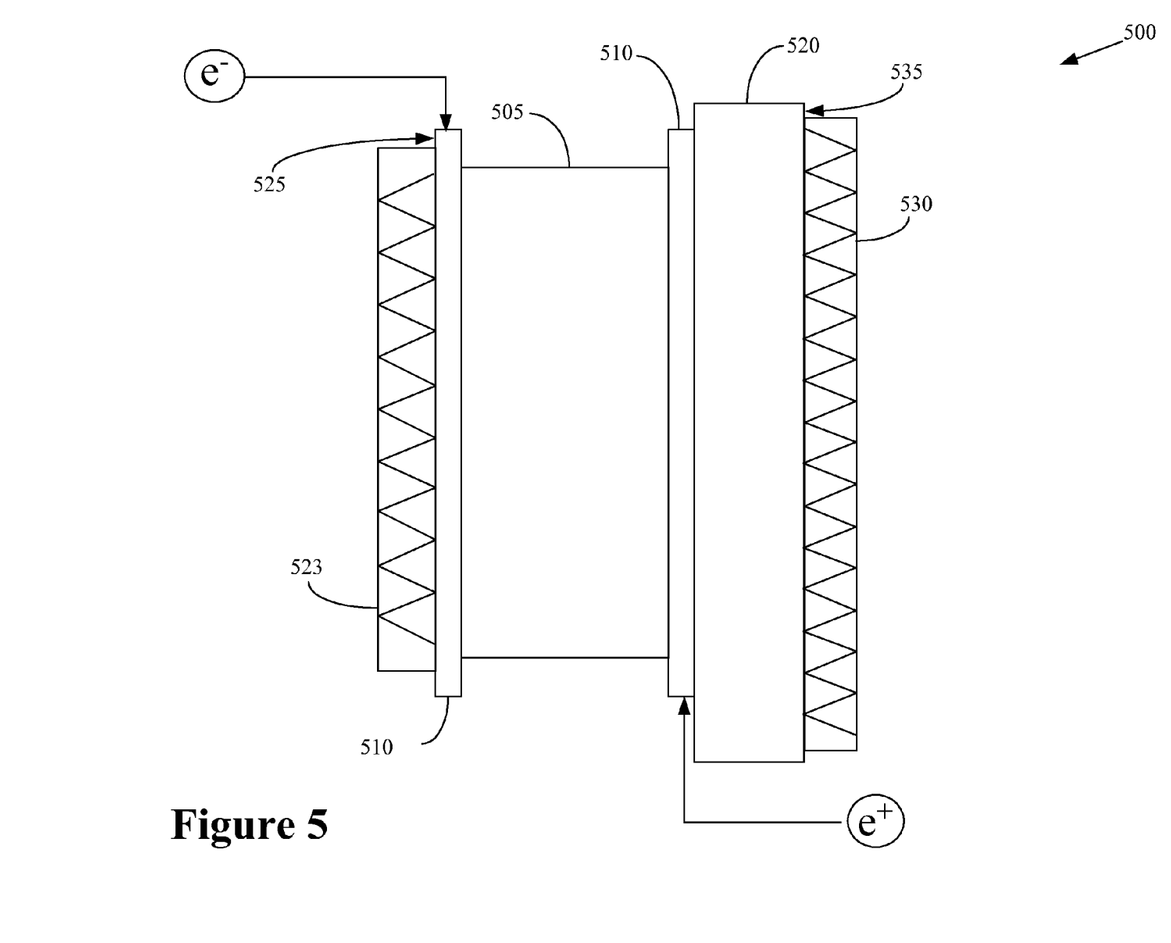
FIG. 5 conceptually illustrates a second exemplary embodiment of an OLED, in accordance with the present invention.

FIG. 5 conceptually illustrates a second exemplary embodiment of an OLED 500 that includes an emissive layer 505 sandwiched between an anode 510 and a cathode 515, and the anode 510 is formed on a glass substrate 520. In the illustrated embodiment, a relief structure 523 is provided adjacent the interface 525 at one surface of the cathode 515. For example, the relief structure 523 may be laminated onto the interface 525 using embodiments of the lamination techniques described above. The relief structure 523 may function as an output coupler so that at least a portion of the light that intersects the interface 525 at an angle that is greater than the critical angle for total internal reflection at an interface between the material used to form the cathode 515 and air may pass through the interface 525. In one embodiment, a relief structure 530 may also be formed adjacent the interface 535 with the substrate 520. Consequently, the external quantum efficiency of the OLED 500 may be increased by providing the relief structure 523 adjacent the interface 525 and/or the relief structure 530 adjacent the interface 535. Furthermore, as discussed above, the relief structures 523, 530 may be used to encapsulate at least a portion of the OLED 500.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a pattern in an elastomer, the pattern including a plurality of relief structures; and
    laminating at least a portion of the pattern to a surface of an organic light emitting diode by bringing the relief structures into direct conformal contact with the surface of the organic light emitting diode.

2. The method of claim 1, wherein forming the pattern in the elastomer comprises forming the relief structures in at least one surface of the elastomer; wherein the relief structures have at least one characteristic dimension that is approximately equal to a characteristic wavelength of light emitted by the organic light emitting diode.

3. The method of claim 1, wherein forming the pattern in the elastomer comprises forming a pattern in a silicon-containing elastomer comprising a curable composition including at least one of polysiloxane, a block copolymer containing segments of siloxane repeat units and organic repeat units, or a silicon-modified polymer.

4. The method of claim 3, wherein forming the pattern in the silicon-containing elastomer comprises forming a pattern in a silicon-containing elastomer comprising a curable polydimethylsiloxane (PDMS).

5. The method of claim 1, wherein forming the pattern comprises:
    depositing a silicon-containing composition on a master pattern without depositing release layers between the silicon-containing composition and the master pattern;
    allowing the silicon-containing composition to at least partially cure into the elastomer; and
    removing the at least partially cured elastomer from the master pattern.

6. The method of claim 5, wherein forming the pattern further comprises spin-casting the silicon-containing composition onto the master pattern.

7. The method of claim 5, comprising performing additional curing of the at least partially cured elastomer after removing the at least partially cured elastomer from the master pattern.

8. The method of claim 5, wherein forming the pattern further comprises bonding the pattern to a flexible substrate; wherein laminating at least a portion of the surface of the pattern to the surface of the organic light emitting diode comprises laminating the relief structures to the surface of the organic light emitting diode using van der Waals interactions between the relief structures and the surface of the organic light emitting diode.

9. The method of claim 1, wherein laminating at least a portion of the pattern to the surface of the organic light emitting diode comprises laminating at least a portion of the pattern to the surface using soft contact lamination.

10. The method of claim 1, wherein laminating at least a portion of the pattern to the surface of the organic light emitting diode comprises laminating at least a portion of the pattern to a surface of a glass substrate in the organic light emitting diode.

11. The method of claim 1, wherein laminating at least a portion of the pattern to the surface of the organic light emitting diode comprises laminating at least a portion of the pattern to a surface of at least one of an anode or a cathode in the organic light emitting diode.

* * * * *

UNITED STATES PATENT AND TRADEMARK OFFICE
CERTIFICATE OF CORRECTION

PATENT NO. : 8,685,195 B2  Page 1 of 1
APPLICATION NO. : 12/161971
DATED : April 1, 2014
INVENTOR(S) : Shim et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1513 days.

Signed and Sealed this

Twenty-ninth Day of September, 2015

Michelle K. Lee
*Director of the United States Patent and Trademark Office*